United States Patent [19]
Hunninghaus et al.

[11] Patent Number: 5,157,274
[45] Date of Patent: Oct. 20, 1992

[54] ELECTRICAL INTERFACE CIRCUIT

[75] Inventors: Roy E. Hunninghaus, Des Plaines; Robert M. Hess, Arlington Heights, both of Ill.

[73] Assignee: Motorola, Inc., Schaumburg, Ill.

[21] Appl. No.: 516,407

[22] Filed: Apr. 30, 1990

[51] Int. Cl.$^5$ .............................................. H02J 5/00
[52] U.S. Cl. ................................... 307/149; 323/909; 330/85
[58] Field of Search ................. 330/85, 260; 323/274, 323/909; 307/149, 112, 116

[56] References Cited

U.S. PATENT DOCUMENTS

| | | | |
|---|---|---|---|
| 4,222,012 | 9/1980 | Yokoyama | 330/85 |
| 4,280,102 | 7/1981 | Yokoyama | 330/85 |
| 4,291,276 | 9/1981 | Ida | 330/85 |
| 4,571,553 | 2/1986 | Yokoyama | 330/85 |

Primary Examiner—Jeffrey A. Gaffin
Attorney, Agent, or Firm—Peter Hudson

[57] ABSTRACT

An electrical interface circuit (200), for use with a zirconium dioxide sensor (202), includes an input differential amplifier (208) having its inverting input coupled to the circuit input (204) to receive a sensor voltage relative to sensor ground potential, and having its output coupled to the circuit output (210) to produce an output voltage relative to circuit ground potential. Additionally a feedback differential amplifier (214) has its inverting input coupled to the circuit output (210), its non-inverting input coupled to sensor ground potential, and its output coupled to the non-inverting input of the input differential amplifier (208) so that voltage change at the circuit input due to change of sensor ground potential relative to circuit ground potential is substantially cancelled.

13 Claims, 2 Drawing Sheets

ELECTRICAL INTERFACE CIRCUIT

BACKGROUND OF THE INVENTION

This invention relates to an electrical interface circuit and particularly, though not exclusively, to an interface circuit providing a high impedance input for a sensor being read and providing compensation for ground shift errors in the sensor output.

A zirconium dioxide sensor (sometimes referred to as a lambda, or oxygen, sensor), commonly used in automobile engine/fuel-control systems, produces an output voltage (in the range of 0 to 1 volt) representative of combusted air/fuel mixture. Such a sensor has an extremely variable effective output resistance (from tens of MegOhms to hundreds of Ohms) as a function of sensor element temperature. In one common construction of a zirconium dioxide sensor, the sensor element is designed to be electrically connected to the mechanical sensor mounting body, making the sensor ground at the same potential as the engine block ground. However, as is well known, due to different current ground return paths in a vehicle, an electronic module's ground potential (commonly referred to as "circuit" ground) may differ from the actual engine block ground potential by as great as ±1 volt. Thus, an interface circuit for reading a "grounded body" zirconium dioxide sensor output voltage must discriminate between the sensor output voltage and any ground shift, and must be unaffected by the sensor's wide range of output impedance. Thus, such an interface circuit must be both high impedance and have differential characteristics.

Unfortunately, a typical simple single operational amplifier differential circuit does not have a suitably high enough input impedance for the use with a zirconium dioxide sensor, and a typical simple single operational amplifier high impedance input circuit can not easily be made to adequately perform differentially, particularly when the sensor output voltage referenced to the engine ground is less than the circuit ground. Thus, these typical operational amplifier circuits are not suitable for use with a "grounded body" zirconium dioxide sensor.

Also, in some applications it is desirable for the interface circuit to have some input to output gain capability. However, increasing the gain can limit the interface circuit's ground shift rejection capability, and compromises must be made in the circuit design to limit this undesired interaction.

OBJECTS OF THE INVENTION

It is an object of the present invention to provide an improved electrical interface circuit wherein the above disadvantages may be overcome or at least alleviated.

BRIEF DESCRIPTION OF THE DRAWINGS

Two electrical interface circuits in accordance with the present invention will now be described, by way of example only, with reference to the accompanying drawings, in which.

DESCRIPTION OF THE PREFERRED EMBODIMENTS

Figure 1:
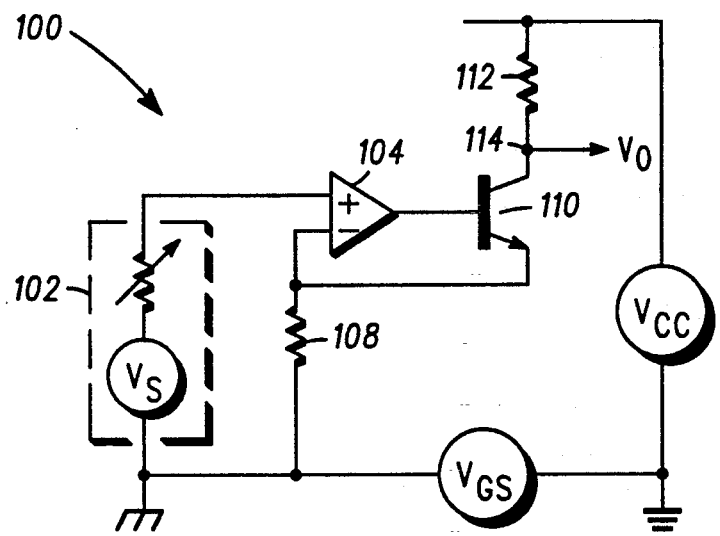
FIG. 1 shows a circuit diagram of a prior art interface circuit.

Referring now to FIG. 1, a known, prior art interface circuit 100 for use with a zirconium dioxide sensor 102 includes an operational amplifier 104. The operational amplifier 104 has its non-inverting input connected to receive the output voltage from the zirconium dioxide sensor 102. The operational amplifier 104 has its inverting input connected, via a resistor 108, to engine ground, the same as sensor ground. A bipolar npn transistor 110 has its collector connected, via a resistor 112, to a reference potential $V_{cc}$ relative to a circuit ground which may differ from the engine/sensor ground by a ground shift voltage $V_{GS}$. The transistor 110 has its collector also connected to an output terminal 114. The transistor 110 has its base connected to the output of the operational amplifier 104, and has its emitter connected to the inverting input of the operational amplifier 104 and to the resistor 108.

In use of the prior art interface circuit 100, the operational amplifier 104, the transistor 110 and the current setting resistor 108 act as a high impedance voltage-to-current convertor, with their output current (the collector current of the transistor 110) being carried by the resistor 112 (acting as a current-to-voltage convertor) to produce the interface circuit's output voltage. The combination of the non-inverting operational amplifier 104 driving the emitter follower transistor 110 is used to control the voltage across the current setting resistor 108 to the same value as the sensor input voltage to the interface circuit. Since the voltages at the inverting and non-inverting inputs of the operational amplifier 104 are both relative to the same engine/sensor ground, any drift in the engine/sensor ground potential with respect to the circuit ground potential is canceled by the operational amplifier 104 in the output voltage produced at the output terminal 114. Although not shown, the negative supply voltage to the operational amplifier 104 is connected to the sensor ground potential so that if the sensor output voltage $V_S$ is less than the circuit ground potential the interface circuit will still function. The interface circuit's output voltage $V_o$ is given by the equation:

$$V_O = V_{CC} - V_S * \frac{R_{112}}{R_{108}},$$

$R_{112}$ and $R_{108}$ being the values of the resistors 112 and 108.

However, the collector current of the transistor 110 is different from the current through the current setting resistor 108 by an amount $\beta(\beta+1)$, where $\beta$ is the current gain of the transistor 110. Thus, it will be appreciated that the current gain of the transistor is an uncontrolled error source as the current gain varies in operation with transistor temperature. It will also be appreciated that, since the operation of the prior art interface circuit 100 is dependent on impressing the zirconium dioxide sensor voltage across the current setting resistor 108, any positive ground shift of engine ground relative to circuit ground must be added to the zirconium dioxide sensor voltage, producing a restriction on the interface circuit's gain/range capability.

Figure 2:
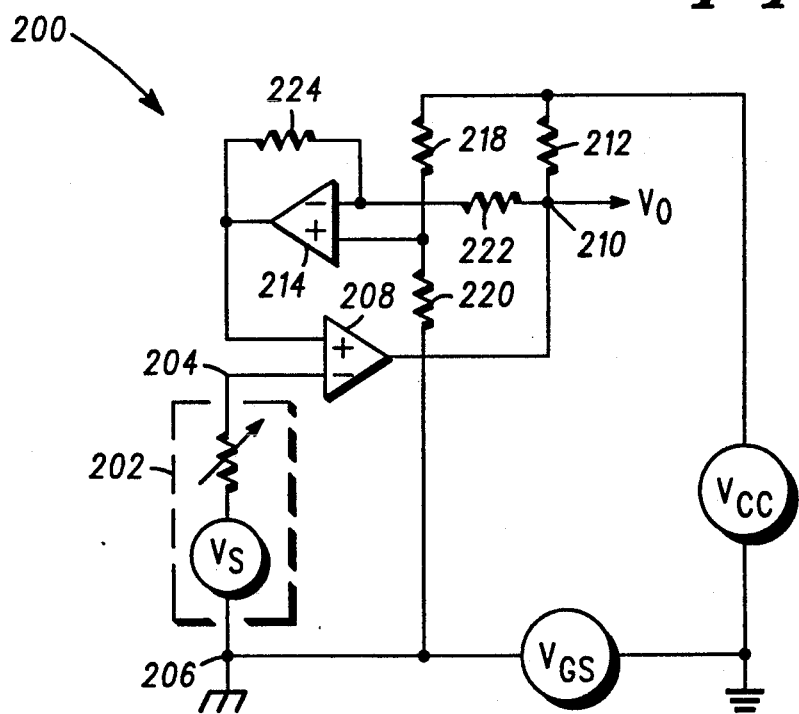
FIG. 2 shows a circuit diagram of a first interface circuit in accordance with a preferred embodiment of the present invention.

Referring now to FIG. 2, a first interface circuit 200 in accordance with the present invention for use with a zirconium dioxide sensor 202 (shown in idealized form as a voltage source $V_S$ and a variable resistance) has input terminals 204, 206 across which the sensor output voltage is applied. A first differential operational amplifier 208 has its inverting input connected to the input terminal 204. The operational amplifier 208 has its output connected to an output terminal 210 of the interface circuit. The interface circuit's output terminal 210 is connected, via a resistor 212, to a reference potential $V_{CC}$ relative to a circuit ground which may differ from the engine/sensor ground by a ground shift voltage $V_{GS}$.

A second differential operational amplifier 214 has its non-inverting input connected, via a resistor 218, to the reference potential $V_{CC}$ and connected, via a resistor 220, to the input terminal 206. The operational amplifier 214 has its inverting input connected, via a resistor 222, to the output terminal 210. The operational amplifier 214 has its output connected, via a resistor 224, to its inverting input. The output of the operational amplifier 214 is also connected to the amplifier 208 at its non-inverting input. The ratio $$\frac{R_{218}}{R_{220}}$$

of the values of the resistors 218 and 220 is chosen to be equal to the ratio $$\frac{R_{222}}{R_{224}}$$

of the values of the resistors 222 and 224. The ratio of these resistor values sets the relationship of the voltage across the resistor 212 to the voltage between the non-inverting input of the operational amplifier 208 and the input terminal 206. Although not shown, the negative supply voltage to the operational amplifier 208 is connected to the sensor ground potential so that if the sensor output voltage $V_s$ is less than the circuit ground potential the interface circuit will still function.

In operation of the interface circuit of FIG. 2, the voltage $V_o$ at the output terminal 210 can be shown to be given by the equation:

$$V_O = V_{CC} - \left\{ \frac{R_{222}}{R_{224}} \cdot [(V_S + V_{GS}) - \left( V_{GS} \cdot \left[ 1 + \frac{R_{224}}{R_{222}} \right] \cdot \left[ 1 / \left( 1 + \frac{R_{220}}{R_{218}} \right) \right] \right) ] \right\} \quad (1)$$

Since the ratios $$\frac{R_{222}}{R_{224}} \text{ and } \frac{R_{218}}{R_{220}}$$

are chosen to be equal, the following equality is satisfied:

$$\left[ 1 + \frac{R_{224}}{R_{222}} \right] \cdot \left[ 1 / \left( 1 + \frac{R_{220}}{R_{218}} \right) \right] = 1 \quad (2)$$

Thus, substituting equation (2), equation (1) reduces to:

$$V_O = V_{CC} - \left\{ \frac{R_{222}}{R_{224}} \cdot V_S \right\} \quad (3)$$

It will thus be seen from equation (3) that the voltage $V_O$ at the output terminal 210 is independent of any ground shift voltage $V_{GS}$.

In operation the interface circuit of FIG. 2 functions as follows. The output voltage from the zirconium dioxide sensor 202 is applied across the input terminals 204 and 206. The applied zirconium dioxide sensor voltage is buffered by the operational amplifier 208 to produce an output voltage at the output terminal 210. To the inverting input of the operational amplifier 214 is applied the voltage across the resistor 222 and the voltage across the resistor 224. To the non-inverting input of the operational amplifier 214 is applied the voltage across the resistor 218 and the voltage across the resistor 220.

The output of the operational amplifier 214 adjusts so that the voltages applied to its inverting and non-inverting inputs are equal, producing a voltage at the output of the operational amplifier 214 which, when referenced to the sensor/engine ground potential at input terminal 206, is directly proportional to the voltage across the resistor 212. The output of the operational amplifier 214 is also connected to the non-inverting input of the operational amplifier 208, whose inverting input is connected to the sensor 202.

If the voltage at the inverting input of the operational amplifier 208, as set by the output voltage of the sensor 202, is not equal to the voltage at the operational amplifier's non-inverting input, as set by the output voltage of the operational amplifier 214, the operational amplifier 208 causes a change in its output voltage, thereby effecting an adjustment in the voltage across the resistor 212. Since the output voltage of the operational amplifier 214 is directly proportional to the voltage across the resistor 212, a change in the output voltage of the operational amplifier 208 causes a proportional change in the voltage at its non-inverting input, via the active feedback path of the operational amplifier 214 and its associated components. This process of change and adjustment continues until the voltage at the non-inverting input of the operational amplifier 208 is made equal to the voltage at the operational amplifier's inverting input. Since the voltage applied to the non-inverting input of the operational amplifier 208 (by the output of the operational amplifier 214) is proportional to the voltage across the resistor 212 and is caused to be equal to the voltage at the inverting input of the operational amplifier 208 (which is equal to the output voltage of the sensor 202), it can be seen that the voltage across the resistor 212 is directly proportional to the output voltage of the sensor 202. The constant of proportionality is the interface circuit's gain factor K.

The values of the resistors 222, 224, 218 and 220 are selected such that the inverting and non-inverting inputs of both operational amplifiers 214 and 208 become equal when the voltage across the resistor 212 is adjusted to a factor K times greater than the output voltage of the sensor 202. As can be seen from equation (3) above, the gain factor K determined by the ratio of the resistor values $$\frac{R_{222}}{R_{224}} \text{ and } \frac{R_{218}}{R_{220}}.$$

In a particular application, the resistance values were chosen to give a ratio of $$\frac{R_{222}}{R_{224}} = \frac{R_{218}}{R_{220}} = 3,$$

but it will be appreciated that a different desired gain, less or greater than unity, could be achieved by selecting resistor values in a different desired ratio.

It will be understood that since the voltage at the non-inverting input of the operational amplifier 214 is relative to the engine/sensor ground, any shift in the voltage at the input terminal 204 due to any shift in engine ground potential is fed back in equal magnitude in the output of the operational amplifier 214 to the non-inverting input of the operational amplifier 208. Thus, any shift in engine/sensor ground potential with respect to the circuit ground potential is compensated for by the action of the operational amplifier 214, and the output voltage produced at the output terminal 210 is relative to only the circuit ground potential.

It will also be appreciated that, since the interface employs an active feedback path provided by the operational amplifier 214, to set the voltage level at the output terminal, the output voltage is not subject to the uncontrolled operational variations of transistor gain to which the prior art interface circuit of FIG. 1 is subject.

Figure 3:
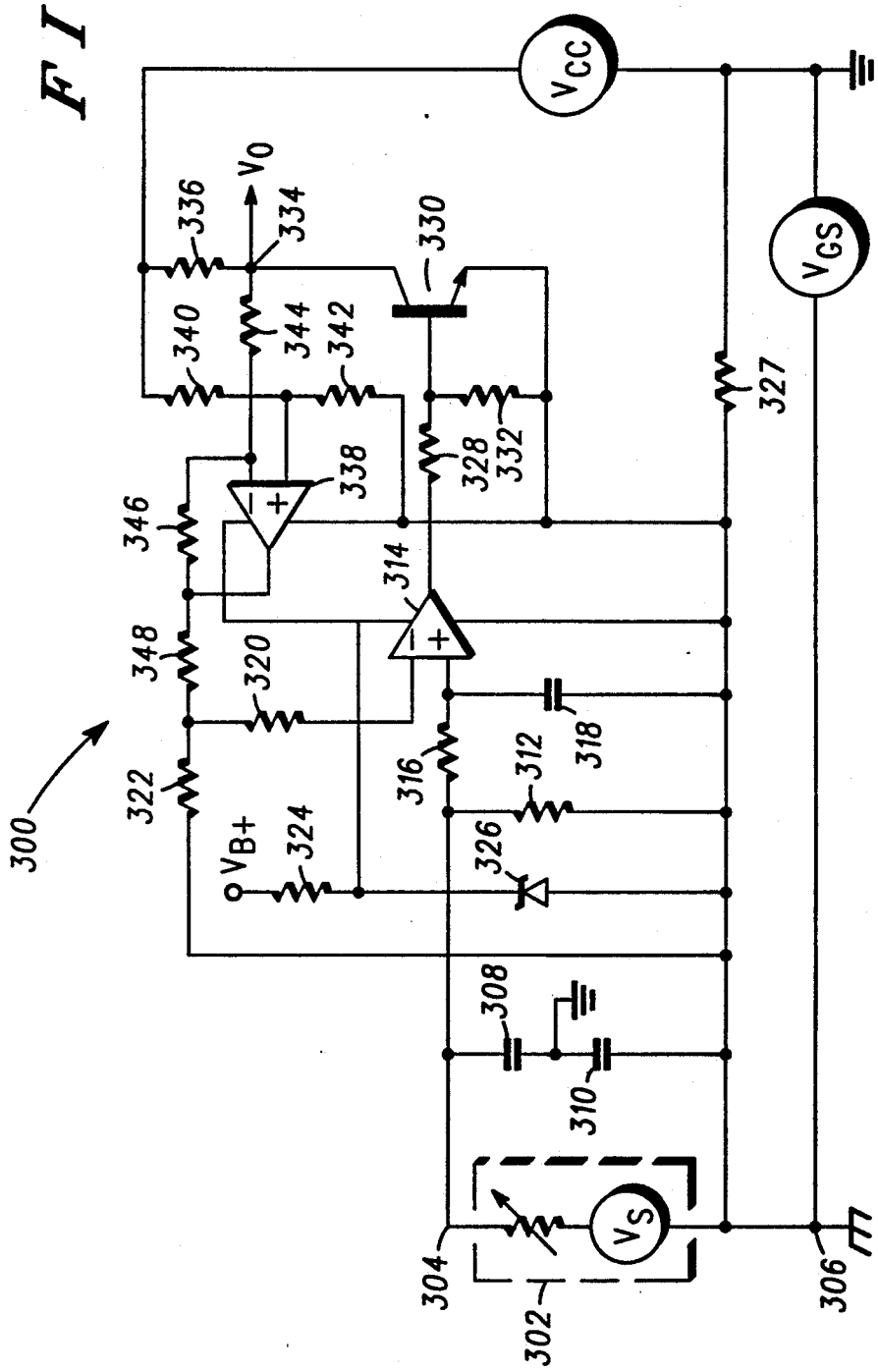
FIG. 3 shows a circuit diagram of a second interface circuit in accordance with the present invention, being a practical implementation of the interface circuit of FIG. 2.

Referring now to FIG. 3, a second interface circuit 300 in accordance with the present invention, being a practical embodiment of the interface circuit 200 described above in relation to FIG. 2, for use with a zirconium dioxide sensor 302 (shown in idealized form as a voltage source $V_S$ and a variable resistance) has differential input terminals 304, 306 across which the sensor output voltage is applied. The input terminals 304, 306 are connected by capacitors 308, 310 (each having a value of approximately 0.001μF) to a chassis ground potential to serve as a high frequency shorting path to reject from the interface circuit the effects of electromagnetic interference. A high impedance resistor 312 (having a value of approximately 1.8MΩ) is also connected across the input terminals 304, 306 and serves to put the interface circuit in a known state in the event that the input terminals 304, 306 become disconnected from the sensor 302. A series combination of resistor 316 (having a value of approximately 10KΩ) and capacitor 318 (having a value of approximately 1nF) is connected across the input terminals 304, 306. The values of the resistor 316 and the capacitor 318 are selected to further reduce input noise voltages which might be present at the connection to the sensor 302 and which are greater than a frequency of interest. Elements 308, 310, 312, 316 and 318 serve only in the practical implementation of FIG. 3 to reduce and/or eliminate stray noise or to put the interface circuit in a known state if undesired disconnection occurs, and do not significantly affect the essential functional operation of the interface circuit.

A differential operational amplifier 314 has its non-inverting input connected, via the resistor 316, to the input terminal 304. The operational amplifier 314 is supplied respectively from the input terminal 306 and via a maximum current limiting resistor 324 (having a value of approximately 10KΩ) from a source of potential $V_{B+}$ (such as the positive terminal of an automobile battery). A Zener diode 326 is connected across the supply terminals of the operational amplifier 314 to provide protection for the operational amplifier 314 in the event of excessive battery line positive or negative transient voltage. A resistor 327 (having a value of approximately 1KΩ) is connected from the input terminal 306, at sensor/engine ground potential, to the circuit ground in order to place the interface circuit in a predictable state if the connection between the input terminal 306 and the sensor/engine ground should become broken. Elements 324, 326 and 327 serve only in the practical implementation of FIG. 3 to protect the interface circuit under adverse transient conditions or to put the interface circuit in a predictable state if an undesired disconnection should occur.

The operational amplifier 314 has its output connected, via a resistor 328 (having a value of approximately 2KΩ) to the base of a bipolar npn transistor 330, with a resistor 332 (having a value of approximately 1KΩ) being connected between the base and emitter of the transistor. The transistor 330 is connected in an inverting ground emitter configuration, with its emitter connected to the input terminal 306 and the negative supply of the operational amplifier 314. The use of the transistor 330 and the resistors 328, 332 in combination with the operational amplifier 314 serve to overcome operational limitations in some common commercially available operational amplifiers which were not considered to exist in the operational amplifier 208 in FIG. 2. With the inputs to the operational amplifier 314 in FIG. 3 inverted, compared with the inputs of the operational amplifier 208 in FIG. 2, the operation of the combination of the operational amplifier 314, the resistors 328, 332 and the transistor 330 can be considered as identical to the operation of the operational amplifier 208 in FIG. 2.

The operational amplifier 314 has its inverting input connected, via resistors 320 and 322 (having respective values of approximately 10KΩ and 300Ω) to the engine/sensor ground potential at input terminal 306, and connected, via the resistor 320 and a resistor 348 (having a value of approximately 700Ω) to the output of a second differential operational amplifier 338.

The transistor 330 has its collector connected to an output terminal 334 of the interface circuit. The interface circuit's output terminal 334 is connected, via a resistor 336 (having a value of approximately 1KΩ), to a reference potential $V_{CC}$ relative to a circuit ground which may differ from the engine/sensor ground by a ground shift voltage $V_{GS}$.

The second differential operational amplifier 338 has its non-inverting input connected, via a resistor 340 (having a value of approximately 20KΩ), to the reference potential $V_{CC}$ and connected, via a resistor 342 (having a value of approximately 20KΩ, to the input terminal 306. The differential operational amplifier 338 has its inverting input connected, via a resistor 344 (having a value of approximately 20KΩ, to the output terminal 334. The differential operational amplifier 338 has its output connected, via a resistor 346 (having a value of approximately 20KΩ), to its inverting input. Like the first differential operational amplifier 314, the differential operational amplifier 338 is supplied respectively from the input terminal 306 and, via the resistor 324, from the source potential $V_{B+}$.

The output of the operational amplifier 338 is connected to the inverting input of the operational amplifier 314 via the resistors 348 and 320, with the resistor 322 connected to the resistors 348 and 320 and to the sensor ground potential at the input terminal 306. The resistor 320 serves to limit the current flowing in the inverting input of the operational amplifier 314 during voltage transients, but does not affect the essential functional operation of the interface circuit.

The resistors 348 and 322 serve to produce a voltage at the inverting input of the operational amplifier 314 which is proportional to, and less than, the output voltage of the operational amplifier 338 as referenced to the sensor/ground potential at the input terminal 306. This proportionality can be expressed as a gain factor $K_2$, given by the equation:

$$K_1 = \frac{R_{348} + R_{322}}{R_{322}}$$

The ratio of the values of the resistors 344 and 346 can be considered as a factor $K_2$. For the circuit of FIG. 3, the voltage at the output terminal 334 can be shown to be given by the equation:

$$V_O = V_{CC} - \left\{ \left( \frac{R_{348} + R_{322}}{R_{322}} \right) * \frac{R_{344}}{R_{346}} * V_S \right\},$$

which reduces to $V_O = V_{CC} - \{K_1 * K_2 * V_S\}$.

For the circuit of FIG. 3 the product $K_1 * K_2$ serves to produce a gain factor similar to the gain factor K in the circuit of FIG. 2. Since the resistors 344 and 346 have the same value of 20KΩ, $K_1 = 1$. With the values of 700Ω and 300Ω chosen for the resistors 348 and 322, $$K_2 = \frac{10}{3} = 3\frac{1}{3}.$$

Thus, the total gain factor is given by $$K_1 * K_2 = 3\frac{1}{3}.$$

Thus, it will be appreciated that in the circuit of FIG. 3 the operational amplifier 338, together with its associated resistors 340, 342, 344 and 346, and in cooperation with the additional resistors 348 and 322, is the functional equivalent of the operational amplifier 214 and its associated resistors 218, 220, 222 and 224 in the circuit of FIG. 2.

The use of the resistors 348 and 322 to produce a voltage at the inverting input of the operational amplifier 314 which is proportional to the output voltage of the operational amplifier 338 serves to overcome operational limitations in some common commercially available operational amplifiers which were not considered to exist in the idealized operational amplifier 214 in the circuit of FIG. 2.

It will therefore be understood that the interface circuit of FIG. 3 operates with approximately the same gain factor and in the same manner as that of the above described interface circuit of FIG. 2, a ground-shift canceling active feedback path analogous to that provided by the differential operational amplifier 214 in the circuit of FIG. 2 being provided by the differential operational amplifier 338 in the circuit of FIG. 3 to set the voltage level at the output terminal, thereby ensuring that the output voltage is not subject to the uncontrolled operational variations to which the prior art interface circuit of FIG. 1 is subject.

It will also be appreciated that although the invention has been described above with reference to interface circuits for use with zirconium dioxide sensors, the invention could be equally applied to any interface circuit where the input signal varies across a wide range, where a high impedance input is required, or where rejection of ground-shift is important. A typical alternative use would be for mass air flow sensors in automobiles.

It will be appreciated that various modifications or alternatives to the above described embodiment will be apparent to the person skilled in the art without departing from the inventive concept of employing an active feedback loop in conjunction with a differential amplifier to produce ground-shift cancellation and accurate voltage output.

We claim:

1. An electrical interface circuit having an input node for receiving an input voltage and an output node for producing an output voltage, the circuit comprising:

differential amplifier means having first and second inputs and an output, the first input being coupled to the input node to receive therefrom a voltage relative to a first potential, and the output being coupled to the output node to produce thereat an output voltage relative to a second potential; and differential feedback means having first and second inputs and an output, the first input being coupled to the output node to receive a voltage representative of the voltage thereat, the second input being coupled to the first potential and to the second potential, and the output being coupled to the second input of the differential amplifier means, whereby voltage change at the input node due to change of the first potential relative to the second potential is reduced.

2. An electrical interface circuit according to claim 1 wherein the output node is coupled to the second potential.

3. An electrical interface circuit according to claim 1 wherein the output of the differential feedback means is coupled to its first input.

4. An electrical interface circuit according to claim 1 wherein the first input of the differential amplifier means is an inverting input and the second input of the differential amplifier means is a non-inverting input.

5. An electrical interface circuit according to claim 1 wherein the output of the differential amplifier means is coupled to the output node via transistor means.

6. An electrical interface circuit according to claim 5 wherein the first input of the differential amplifier means is a non-inverting input and the seconds input of the differential amplifier means is an inverting input.

7. An electrical interface circuit according to claim 1 wherein the output of the differential feedback means is coupled to the first potential.

8. An electrical interface circuit according to claim 1 wherein the differential feedback means comprises a differential amplifier having as the first input an inverting input and having as the second input a non-inverting input.

9. An electrical interface circuit according to claim 1 wherein voltage change at the input node due to change of the first potential relative to the second potential is substantially canceled.

10. An electrical interface circuit according to claim 1 wherein the electrical interface circuit has a gain factor less than unity.

11. An electrical interface circuit according to claim 1 wherein the electrical interface circuit has a gain factor greater than unity.

12. An electrical interface circuit having an input node for receiving an input voltage and an output node for producing an output voltage, the circuit comprising:
   differential amplifier means having first and second inputs and an output, the first input being coupled to the input node to receive therefrom a voltage relative to a first potential, and the output being coupled to the output node to produce thereat an output voltage relative to a second potential; and
   differential feedback means having first and second inputs and an output, the first input being coupled to the output node to receive a voltage representative of the voltage thereat, the second input being coupled to the first potential, and the output being coupled to the first input of the differential feedback means and coupled to the second input of the differential amplifier means,
   the differential amplifier means and the differential feedback means being so arranged that voltage change at the input node due to change of the first potential relative to the second potential is substantially canceled.

13. An electrical interface circuit having an input node for receiving an input voltage and an output node for producing an output voltage, the circuit comprising:
   differential amplifier means having first and second inputs and an output, the first input being coupled to the input node to receive therefrom a voltage relative to a first potential, and the output being coupled to the output node to produce thereat an output voltage relative to a second potential;
   transistor means coupled between the output of the differential amplifier means and the output node; and
   differential feedback means having first and second inputs and an output, the first input being coupled to the output node to receive a voltage representative of the voltage thereat, the second input being coupled to the first potential, and the output being coupled to the first input of the differential feedback means and coupled to the second input of the differential amplifier means,
   the output node being coupled to a reference potential and the output of the differential feedback means being coupled to the second potential, and the differential amplifier means and the differential feedback means being so arranged that voltage change at the input node due to change of the first potential relative to the second potential is substantially canceled.

* * * * *